US007418645B2

(12) United States Patent
Srivastava

(10) Patent No.: US 7,418,645 B2
(45) Date of Patent: Aug. 26, 2008

(54) ERROR CORRECTION/DETECTION CODE ADJUSTMENT FOR KNOWN DATA PATTERN SUBSTITUTION

(75) Inventor: Vipul Srivastava, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 623 days.

(21) Appl. No.: 10/671,189

(22) Filed: Sep. 24, 2003

(65) Prior Publication Data

US 2005/0066251 A1 Mar. 24, 2005

(51) Int. Cl.
*H03M 13/00* (2006.01)
(52) U.S. Cl. .................... 714/758; 714/770; 714/768
(58) Field of Classification Search .............. 714/758, 714/763, 764, 766, 52, 54, 777, 770
See application file for complete search history.

(56) References Cited

U.S. PATENT DOCUMENTS

| | | | | | |
|---|---|---|---|---|---|
| 3,745,526 | A | | 7/1973 | Hong et al. | |
| 4,866,717 | A | * | 9/1989 | Murai et al. | 714/765 |
| 5,020,060 | A | | 5/1991 | Mruai et al. | |
| 5,640,286 | A | * | 6/1997 | Acosta et al. | 360/48 |
| 5,689,729 | A | * | 11/1997 | Inoue | 710/52 |
| 5,691,994 | A | * | 11/1997 | Acosta et al. | 714/784 |
| 5,805,799 | A | * | 9/1998 | Fredrickson et al. | 714/52 |
| 6,467,060 | B1 | * | 10/2002 | Malakapalli et al. | 714/758 |
| 6,751,757 | B2 | * | 6/2004 | Biskup et al. | 714/54 |
| 6,799,283 | B1 | * | 9/2004 | Tamai et al. | 714/6 |
| 6,981,171 | B2 | * | 12/2005 | Hashemi | 714/5 |
| 2003/0097520 | A1 | * | 5/2003 | Lai et al. | 711/103 |

OTHER PUBLICATIONS

Barry Cipra, "The Ubiquitous Reed-Solomon Codes", SIAM News, vol. 26, No. 1, Jan. 1993.
"Signal Processing/Integrated Sector Format-Error Correction Code", IBM Almaden Research Center, www.almaden.ibm.com/sst/storage/sp/ecc.shtml.

* cited by examiner

*Primary Examiner*—M. Mujtaba K. Chaudry
*Assistant Examiner*—Fritz Alphonse
(74) *Attorney, Agent, or Firm*—Townsend and Townsend and Crew LLP; Patrick Duncan

(57) ABSTRACT

Techniques for updating cyclic redundancy check (CRC) bytes for data sectors that have been reassigned to a new logical block address (LBA) are provided. The entire set of CRC check bytes is not recalculated each time that a data sector is reassigned to a new LBA. Instead, only the portion of the CRC check bytes effected by the new LBA are updated. An exclusive OR function is performed on the old LBA and the new reassigned LBA for a data sector. Galois Field multiplication is then performed on the result of the XOR function to generate updated portions of CRC bytes that correspond to the reassigned LBA. An exclusive OR function is then performed on the updated portions of the CRC bytes and the old CRC bytes to generate new CRC bytes.

21 Claims, 2 Drawing Sheets

ERROR CORRECTION/DETECTION CODE ADJUSTMENT FOR KNOWN DATA PATTERN SUBSTITUTION

BACKGROUND OF THE INVENTION

The present invention relates to techniques for updating cyclic redundancy check bytes in a data storage system, and more particularly, to techniques for updating cyclic redundancy check bytes to correspond to a reassigned logical block address.

A computer host system can store bytes of data onto a magnetic hard disk using a disk drive. The disk drive writes the data bytes onto the magnetic hard disk using a write element. Disk drives systems typically write data bytes onto disks in 512 byte long sectors. Each sector is associated with a logical block address (LBA) that identifies the location of the sector on the disk. The host system transfers data bytes and corresponding LBAs for each sector to the disk drive.

The disk drive generates error correction code (ECC) check bytes and cyclic redundancy check (CRC) bytes to correct errors in the data bytes. ECC and CRC engines generate the check bytes as soon as the disk drive receives the data bytes from the host. The ECC and CRC check bytes are used to protect the data bytes from errors using well known encoding processes.

ECC and CRC engines seed both the data bytes and the LBA into the encoding processes used to generate the ECC and CRC check bytes for each sector. The LBA is not written onto the disk. However, the ECC and CRC engines treat the data bytes and the LBA for a sector as one set of bytes that is used to generate the ECC and CRC check bytes.

When the disk drive system reads data from the disk, the ECC and CRC engines decode the ECC and CRC bytes to detect and correct errors within the data bytes. The ECC engine points out which of the data bytes within a sector, if any, contain errors. The ECC engine can calculate the location and the value of errors within the sector. For example, the ECC engine may determine that one or more of the data bytes within a sector contain errors. The ECC engine can correct up to a programmable number of errors within the data bytes.

As another example, the ECC engine may determine that one or more the of LBA bytes that correspond to a sector of data contain errors. If the LBA encoded into the ECC check bytes does not match the LBA from which the data was read, the ECC engine determines that the disk drive read data from the wrong sector.

Magnetic disks often contain small defects. These defects prevent data from being accurately written onto and read from portions of the disk. Prior art systems have been developed to log the sectors of a disk that contain such defects. These logs record the logical block addresses (LBAs) of the sectors on a particular disk that contain defects. When a host computer system attempts to write data bytes to an LBA, the disk drive system checks to see if that LBA is recorded in the log as an LBA that contains a defect.

If the LBA for a sector of data is recorded in the defect log list, the disk drive system reassigns the data to a different LBA on the disk that does not contain a defect. The LBA reassignment process occurs after the CRC engine has calculated the CRC check bytes and stored the data and check bytes into DRAM. Thus, the CRC check bytes were calculated based on the old LBA. After the data bytes have been assigned a new sector with a new LBA, the CRC check bytes that were calculated based on the old LBA can no longer be relied upon to correct errors in the data.

The CRC engine can calculate new CRC bytes using the new LBA and replace the old CRC bytes with the new CRC bytes. However, this process uses a substantial amount of system time.

Also, the CRC engine must recalculate the CRC bytes based on data bytes that have temporarily been stored in DRAM before they are written onto the disk. The DRAM often introduces errors into the data bytes depending on the soft error rate of the DRAM. If the DRAM introduces errors into the data bytes, the new CRC bytes will be based on corrupted data bytes. Thus, if the new CRC bytes are subsequently used to detect errors in the sector, the CRC engine will restore the data bytes to the corrupted data values.

Therefore, it would be desirable to provide faster and more accurate techniques for updating CRC check bytes for data bytes that have been reassigned to a new LBA.

BRIEF SUMMARY OF THE INVENTION

The present invention provides techniques for updating cyclic redundancy check (CRC) bytes for data sectors that have been reassigned to a new logical block address (LBA). The entire set of CRC check bytes is not recalculated each time that a data sector is reassigned to a new LBA. Instead, the present invention updates only a portion of the CRC check bytes that are effected by the new LBA.

The present invention performs an exclusive OR (XOR) function on the old LBA and the new reassigned LBA for a data sector. Galois Field multiplication is then performed on the result of the XOR function to generate an output that indicates the contribution of the new LBA to the CRC bytes. The present invention then performs an XOR function on the old CRC bytes and the output of the Galois Field multiplication to generate new CRC bytes. The new CRC bytes can be used by a CRC engine to protect from errors in the data bytes after the data bytes have been assigned to the new LBA sector.

The techniques of the present invention protect the integrity of the data bytes by updating the CRC bytes to reflect the LBA of the reassigned sector. The techniques of the present invention are also faster than recalculating all of the CRC bytes, because only a portion of the CRC bytes are updated to reflect the reassigned LBA. These techniques save processing time and resources.

The techniques of the present invention do not use the data bytes stored in DRAM to recalculate the CRC bytes, so that corrupted data introduced into the data bytes by the DRAM does not effect the new updated CRC bytes. Therefore, the techniques of the present invention are less susceptible to generating errors in the new CRC bytes.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
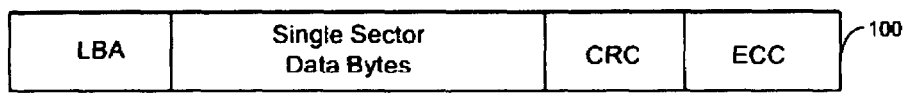
FIG. 1 illustrates a data sector for a data storage medium according to the present invention.

FIG. 1 illustrates a data sector 100. Data sector 100 is a format for storing data onto a data storage medium such as a magnetic hard disk. The data sector 100 includes a group of data bytes (e.g., 512 data bytes), and a logical block address (LBA). The LBA corresponds to the location that the data sector 100 is stored on the disk. The LBA is typically not stored on the disk. Sector 100 also includes CRC and ECC bytes that are used to detect and correct errors in the data bytes.

The present invention applies to many types of data storage systems and media such as optical and magnetic hard disks and disk drives. Magnetic hard disk drives are discussed herein for illustrative purposes only and are not intended to limit the scope of the present invention.

Figure 2:
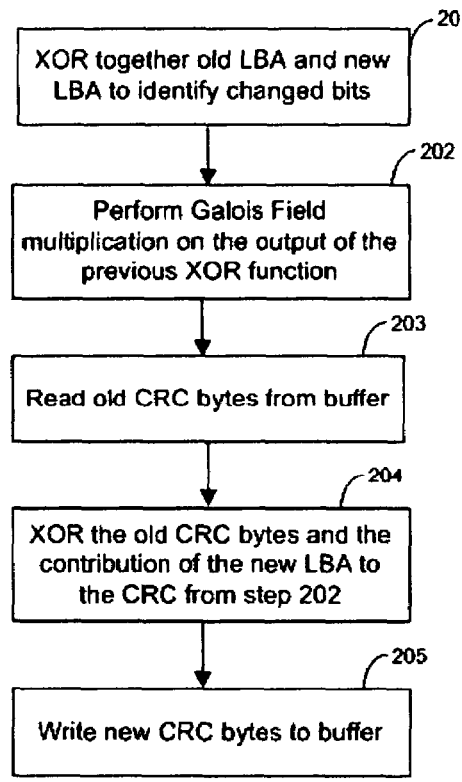
FIG. 2 illustrates a process for updating cyclic redundancy check (CRC) bytes for data sectors that have been reassigned to a new logical block address (LBA) according to an embodiment of the present invention.
Figure 3:
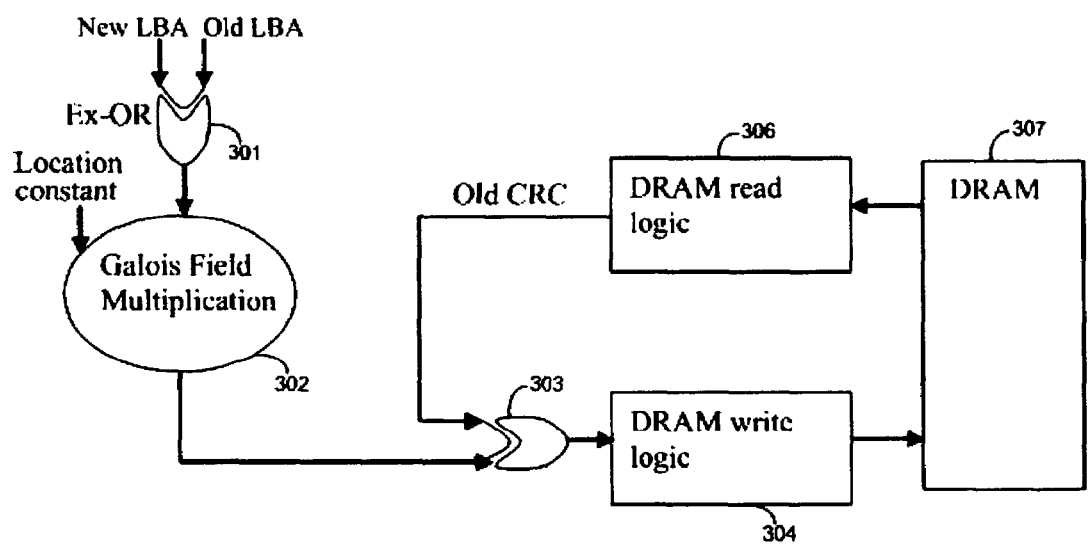
FIG. 3 illustrates a block diagram of a hardware system for updating cyclic redundancy check (CRC) bytes for data sectors that have been reassigned to a new logical block address (LBA) according to an embodiment of the present invention.

FIG. 2 illustrates a process for updating cyclic redundancy check (CRC) bytes for data sectors that have been reassigned to a new logical block address (LBA) according to an embodiment of the present invention. FIG. 3 illustrates a block diagram of a hardware system for updating CRC bytes for data sectors that have been reassigned to a new LBA according to an embodiment of the present invention.

Figure 4:
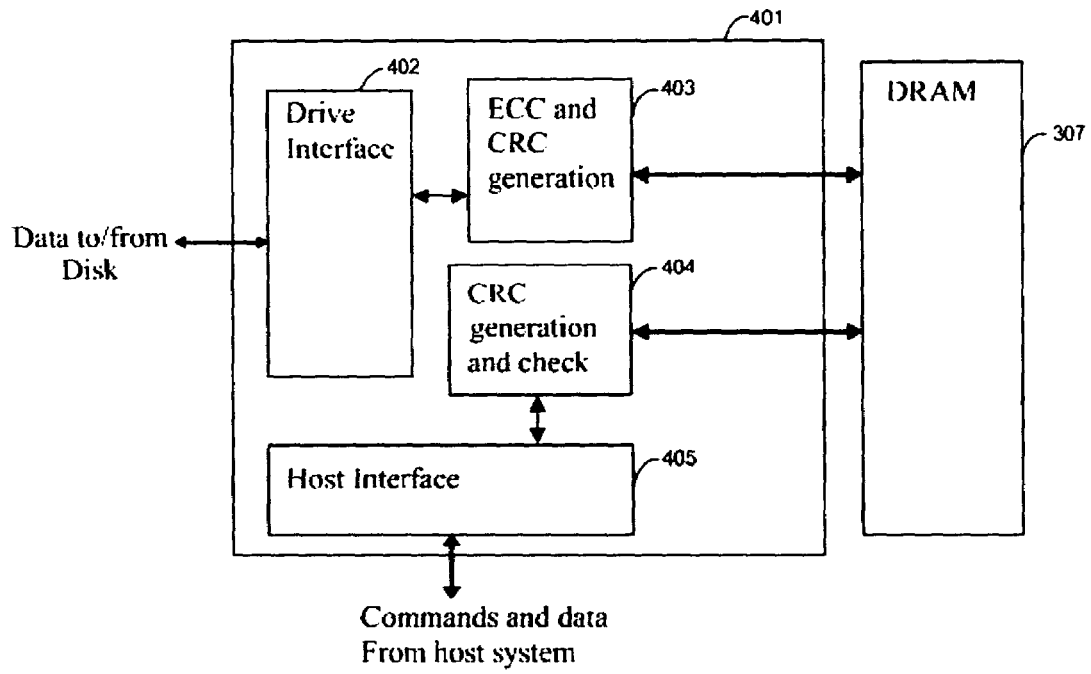
FIG. 4 illustrates a block diagram of an error correction system according to a embodiment of the present invention.

FIG. 4 illustrates a block diagram of an error correction system 401 according to an embodiment of the present invention. Data correction system 401 includes a drive interface 402, an ECC and CRC generation engine for disk operations 403, a CRC generation and check engine for host operations 404, and a host interface 405. Engines 403 and 404 communicate with DRAM storage device 307 as shown in FIG. 4. Host interface 405 interfaces with a host data storage system. Drive interface 402 transmits data to and from a disk or other data storage medium.

ECC/CRC generation engine 404 calculates CRC bytes for each sector of data bytes using the original LBA values as soon as host interface 405 receives the data bytes from the host. The CRC bytes are calculated immediately to protect the data from being corrupted, and then the CRC bytes are stored temporality in DRAM buffer 307.

As discussed above, when a host system attempts to store data bytes in a sector on a disk that contains a defect, the disk system reassigns the data bytes to a new sector that has a new LBA. When the disk drive system reassigns a set of data bytes to a new sector with a new LBA, the CRC bytes can no longer accurately protect the data bytes, because the CRC bytes were calculated based on the old LBA.

When data bytes are reassigned to a new sector, the system of FIG. 3 updates the portion of the CRC bytes that are based on the LBA of the old sector so that the CRC bytes are based on the reassigned LBA value. When the CRC bytes are based on the reassigned LBA value, the CRC engine can use these CRC bytes to accurately detect errors in the data bytes within the corresponding sector.

At step 201 in FIG. 2, an exclusive OR (XOR) gate 301 performs an XOR Boolean function on the "old LBA" for the sector that has the defect and the reassigned "new LBA." The XOR function performed at step 201 is also referred to as a modular 2 addition function. XOR gate 301 compares the old and new LBA bytes and identifies which bits are different between these two sets of LBA bytes. The output bytes of XOR gate 301 indicate the difference between the old LBA bytes and the new LBA bytes.

At step 202, circuitry in block 302 performs a Galois Field multiplication function on the output bytes of XOR gate 301. Galois Field multiplication is an algorithm that is well known to those of skill in the data byte error correction art. Galois Field multiplication is an algorithm performed by CRC engines 403 and 404 to generate the CRC bytes based on the data bytes and the LBA. According to the present invention, the process of FIG. 2 recalculates only the portion of the CRC bytes that are based on the LBA bytes.

At step 202, the Galois Field multiplication function is performed by multiplying each byte from XOR gate 301 by a corresponding location constant. The location constants depend on the size of the sector. The results of these multiplications are added together using modular 2 addition (i.e., the XOR function) according to Galois Field multiplication. The output of block 302 indicates the changes to the components of the CRC bytes that are effected by reassigning the data to a new sector that has a different LBA.

A specific example of the Galois Field multiplication process performed at step 202 is now discussed in detail. Each LBA can contain 4 bytes and 32 bits. The output result generated at step 201 also contains 4 bytes. The Galois Field function then multiplies each of the four bytes by corresponding location constants that represent the location of the byte in the sector and adds the results together using modular 2 addition (XOR). This calculation is performed for Galois Field a values to generate the output bytes of step 202.

Equations are shown below that implement the Galois Field multiplication on example values according to an embodiment of the present invention.

Result3=Mul(byte3, k2) XOR Mul(byte2, k3) XOR Mul(byte1, k4) XOR Mul(byte0, k5)

Result2=Mul(byte3, l2) XOR Mul(byte2, l3) XOR Mul(byte1, l4) XOR Mul(byte0, l5)

Result1=Mul(byte3, m2) XOR Mul(byte2, m3) XOR Mul(byte1, m4) XOR Mul(byte0, m5)

Result0=Mul(byte3, n2) XOR Mul(byte2, n3) XOR Mul(byte1, n4) XOR Mul(byte0, n5)

According to the above example, XOR gate 301 generates a 4 byte output value. These 4 bytes are identified as byte3, byte2, byte1, and byte0, respectively, in the equations above. The values k2-k5, l2-l5, m2-m5, and n2-n5 are the location constants. These constants are Galois Field constants that depend on the size of the sector. Example values of these location constants are shown in Table 1 below.

TABLE 1

| Constant | Alpha Value | Value in Hexadecimal |
|---|---|---|
| k2 | $(\alpha^5)^{516}$ | 60 |
| k3 | $(\alpha^5)^{515}$ | 03 |
| k4 | $(\alpha^5)^{514}$ | b4 |
| k5 | $(\alpha^5)^{513}$ | 26 |
| l2 | $(\alpha^6)^{516}$ | 25 |
| l3 | $(\alpha^6)^{515}$ | 60 |
| l4 | $(\alpha^6)^{514}$ | 8f |
| l5 | $(\alpha^6)^{513}$ | 2d |
| m2 | $(\alpha^7)^{516}$ | b5 |
| m3 | $(\alpha^7)^{515}$ | 9c |
| m4 | $(\alpha^7)^{514}$ | 18 |
| m5 | $(\alpha^7)^{513}$ | 75 |
| n2 | $(\alpha^8)^{516}$ | 46 |
| n3 | $(\alpha^8)^{515}$ | 6a |

TABLE 1-continued

| Constant | Alpha Value | Value in Hexadecimal |
|---|---|---|
| n4 | $(\alpha^8)^{514}$ | 9d |
| n5 | $(\alpha^8)^{513}$ | 8f |

The function 'Mul' in the above equations is a well known multiplication function in Galois Field that involves adding the exponents of the α operands. This multiplication function multiplies byte3, byte2, byte1, and byte0 by the constants in Table 1 as shown in the equations above. The results of these multiplication functions are then added together using the XOR function as shown in the above equations to generate four resulting bytes: result3, result2, result1, and result0. The output of block 302 is a four byte value that equals result3, result2, result1, result0. The output of block 302 represents the contribution of the new reassigned LBA to the CRC bytes.

At step 203, the error correction system reads the old CRC bytes that are stored in the buffer memory 307. This step is performed by the DRAM read logic 306 in FIG. 3. The CRC engine calculated the old CRC bytes based on the LBA for the old sector before the data was reassigned to the new sector. The old CRC bytes are stored in DRAM 307. DRAM read logic 306 reads the old CRC bytes from DRAM 307 and provides these CRC bytes to an input of XOR gate 303.

At step 204, XOR gate 303 performs an XOR Boolean function on the old CRC bytes from read logic 306 and the bytes generated by Galois Field multiplier 302. The XOR function performed by gate 303 incorporates the contribution of the new reassigned LBA generated by block 302 into the old CRC bytes. The output signals of XOR gate 303 are the new updated CRC bytes. These new CRC bytes are based on the new reassigned LBA value.

DRAM write logic 304 writes the new CRC bytes to DRAM buffer 307 for the new data sector at step 205. The new CRC bytes can be used by the CRC engines 403 and 404 to detect errors in the data bytes after the data bytes have been assigned to the new LBA sector.

Figure 5:
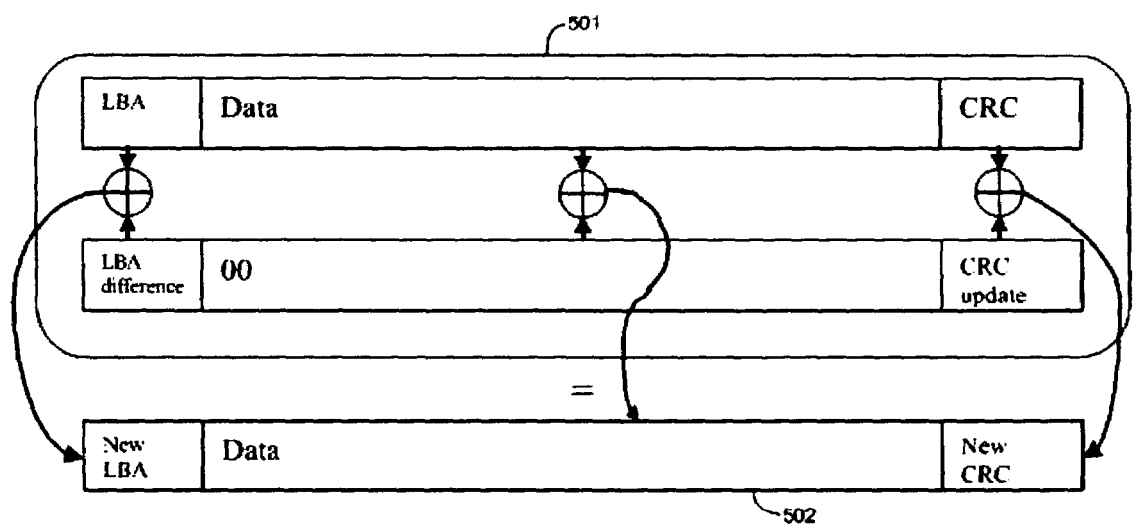
FIG. 5 illustrates how the data sectors are updated with new LBA and CRC bytes according to an embodiment of the present invention.

FIG. 5 illustrates graphically in box 501 that the old LBA bytes, data bytes, and CRC bytes can be XOR'ed with the LBA difference bytes, all zeroes, and the CRC update bytes generated by block 302, respectively. The data bytes are XORed to all zeroes so that the data bytes are not changed. By XORing the CRC update bytes to the old CRC bytes, only the updated bytes are changed in the old CRC bytes to produce the new CRC bytes in sector 502.

The techniques of the present invention protect the integrity of the data bytes by updating the CRC bytes to reflect the new LBA of the reassigned sector. The techniques of the present invention are faster than recalculating all of the CRC bytes, because only the portion of the CRC bytes that are effected by the new LBA are updated.

The techniques of the present invention do not use the data bytes stored in DRAM to recalculate the CRC bytes, so that errors introduced into the data bytes by the DRAM do not effect the new CRC bytes. Therefore, the techniques of the present invention are less susceptible to generating errors in the new CRC bytes.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiments disclosed, but that the invention will include all embodiments and equivalents falling within the scope of the claims.

What is claimed is:

1. A data storage system comprising:
    a controller that reassigns a sector of data from an old logical block address (LBA) to a new logical block address (LBA) when a portion of a data storage medium corresponding to the old LBA contains a defect; and
    a cyclic redundancy check (CRC) engine that generates old cyclic redundancy check bytes based on the old LBA, performs a first exclusive OR (XOR) function only on the old LBA and the new LBA, performs Galois Field multiplication on a result of the first XOR function, and performs a second XOR function on a result of the Galois Field multiplication and the old cyclic redundancy check bytes to generate updated cyclic redundancy check bytes that are based on the new LBA.

2. The data storage system as defined in claim 1 further comprising:
    a memory buffer, wherein the CRC engine writes the updated cyclic redundancy check bytes to the memory buffer.

3. The data storage system as defined in claim 2 wherein the CRC engine stores the old cyclic redundancy check bytes in the memory buffer, and accesses the old cyclic redundancy check bytes from the memory buffer before performing the second XOR function.

4. The data storage system as defined in claim 1 wherein the sector of data contains 512 bytes and the old LBA contains 4 bytes.

5. The data storage system as defined in claim 1 wherein the old LBA and the new LBA are not written onto the disk.

6. The data storage system as defined in claim 1 wherein the controller controls a head that reads and writes data onto the disk.

7. The data storage system as defined in claim 6 wherein the controller is configured to store data onto a magnetic hard disk.

8. A method for updating cyclic redundancy check bytes for a sector of data to reflect a reassignment of the data from an old logical block address (LBA) to a new logical block address (LBA), the method comprising:
    performing a first exclusive OR function only on the old LBA and the new LBA to generate a first result;
    performing Galois Field multiplication on the first result to generate a second result; and
    performing a second exclusive OR function on the second result and old cyclic redundancy check bytes to generate updated cyclic redundancy check bytes that are based on the new LBA,
    wherein the old cyclic redundancy check bytes are generated based on the old LBA.

9. The method according to claim 8 further comprising:
    correcting errors in the data after the data has been assigned to the new LBA using the updated cyclic redundancy check bytes.

10. The method according to claim 8 wherein performing the second exclusive OR function on the second result and the old cyclic redundancy check bytes further comprises performing an exclusive OR function on data bytes in the sector and zero bytes.

11. The method according to claim 8 further comprising:
writing the updated cyclic redundancy check bytes to a memory buffer.

12. The method according to claim 11 further comprising:
calculating the old cyclic redundancy check bytes based on the old LBA;
storing the old cyclic redundancy check bytes in the memory buffer; and
accessing the old cyclic redundancy check bytes from the memory buffer before performing the second exclusive OR function.

13. The method according to claim 8 wherein the sector of data is written to a magnetic hard disk.

14. The method according to claim 8 wherein the old LBA and the new LBA are not written onto the disk.

15. A disk drive error correction system comprising:
a cycle redundancy check (CRC) engine that generates old cyclic redundancy check bytes based on a first logic block address (LBA) for a sector of data, wherein the sector of data is reassigned from the first LBA to a second LBA;
a first XOR gate that performs a first exclusive OR (XOR) function only on the old LBA and the new LBA;
circuitry for performing Galois Field multiplication on a result of the first XOR function; and
a second XOR gate for performing a second XOR function on a result of the Galois Field multiplication and the old cyclic redundancy check bytes to generate updated cyclic redundancy check bytes that are based on the second LBA.

16. The disk drive error correction system according to claim 15 further comprising:
a memory buffer, wherein the CRC engine writes the updated cyclic redundancy check bytes to the memory buffer.

17. The disk drive error correction system according to claim 15 wherein the sector of data is stored on a magnetic hard disk, and the disk drive error correction system interfaces with the hard disk drive host system.

18. The disk drive error correction system according to claim 15 wherein the second XOR gate performs an exclusive OR function on data bytes in the sector and zero bytes.

19. The disk drive error correction system according to claim 15 wherein the old LBA and the new LBA are not written onto the disk.

20. The data storage system of claim 1 wherein performing the second XOR function on a result of the Galois field multiplication and the old cyclic redundancy check bytes further comprises performing an exclusive OR function on data bytes in the sector and zero bytes.

21. The disk drive error correction system of claim 15 wherein performing the second XOR function on a result of the Galois field multiplication and the old cyclic redundancy check bytes further comprises performing an exclusive OR function on data bytes in the sector and zero bytes.

* * * * *